United States Patent [19]

Hidese

[11] Patent Number: 5,208,969
[45] Date of Patent: May 11, 1993

[54] ELECTRONIC COMPONENTS MOUNTING APPARATUS

[75] Inventor: Wataru Hidese, Chikushino, Japan

[73] Assignee: Matsushita Electric Industrial Co., Ltd., Osaka, Japan

[21] Appl. No.: 796,173

[22] Filed: Nov. 22, 1991

[30] Foreign Application Priority Data

Nov. 29, 1990 [JP] Japan .................................. 2-333935

[51] Int. Cl.$^5$ ............................................ B23P 19/00
[52] U.S. Cl. ....................................... 29/740; 29/741; 414/750
[58] Field of Search .................. 29/740, 741; 414/750, 414/416, 222

[56] References Cited

U.S. PATENT DOCUMENTS 4,704,792 11/1987 Itagaki et al. .......................... 29/741
4,999,909 3/1991 Eguchi et al. .......................... 29/740

FOREIGN PATENT DOCUMENTS 1300598 12/1989 Japan .

Primary Examiner—P. W. Echols
Attorney, Agent, or Firm—Lowe, Price, LeBlanc & Becker

[57] ABSTRACT

A type of electronic components mounting apparatus is widely known, by which electronic components on an electronic components feeding device are picked up, while pick-and-place heads are being rotated for indexing along a rotary head, and the electronic components are mounted on a circuit board or a substrate positioned on an X-Y table. The electronic components feeding device moves the tables with feeders over a base in lateral direction to supply the electronic components to the feeders on the pick-and-place heads. With increasing demands on high-speed mounting of the components, the moving speed of the above tables must be increased to attain high-speed mounting. The electronic components feeding device according to the present invention comprises a plurality of tables where feeders of the electronic components are placed, a base where these tables are placed, a first feeding means for moving said tables in lateral direction along which said tables are arranged in a feeding area at central part of said base in order to stop said feeders at pickup position of said pick-and-place heads, and a second feeding means for moving said tables between retreat areas on the sides of said base and said feeding area. As the result, the tables can be moved at high speed and can be stopped at correct position with high accuracy.

7 Claims, 5 Drawing Sheets

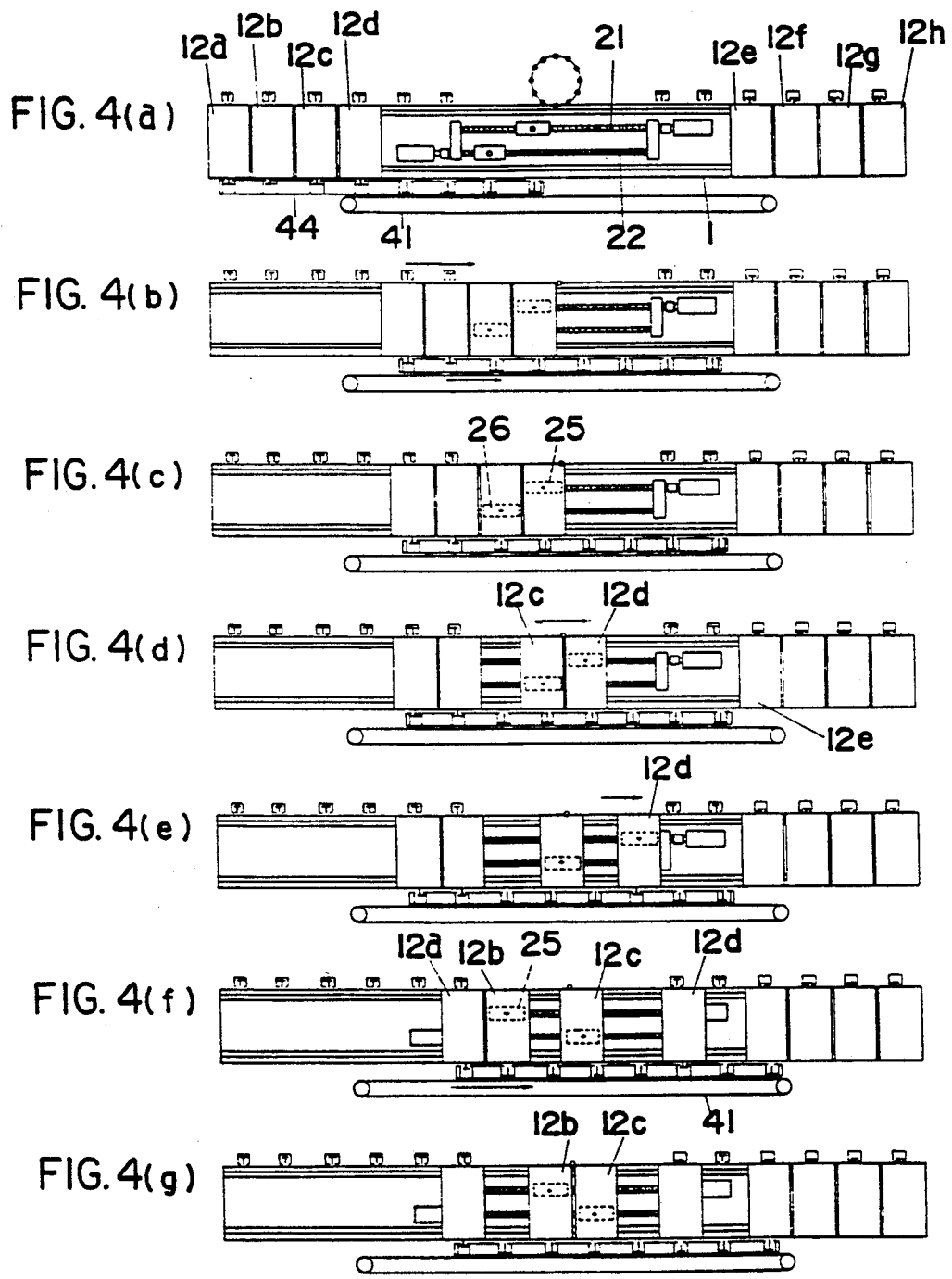

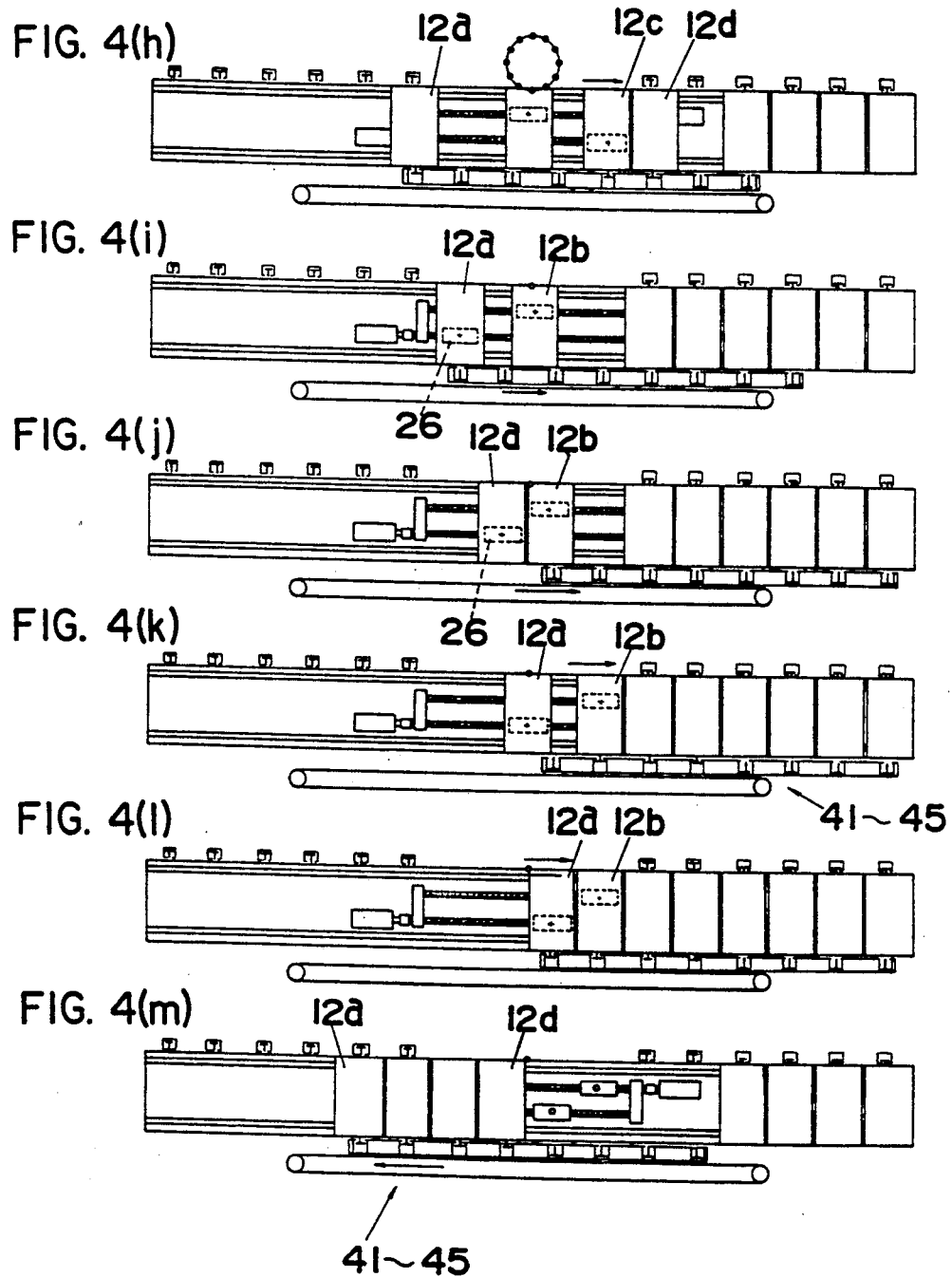

ELECTRONIC COMPONENTS MOUNTING APPARATUS

TECHNICAL FIELD

The present invention relates to an electronic components mounting apparatus, and more particularly to a structure of a device for feeding electronic components to pick-and-place heads of a rotary head.

BACKGROUND OF THE INVENTION

An apparatus for mounting electronic components on a circuit board or a substrate is already known, which comprises an electronic components feeding device, an X-Y table for positioning the circuit board, and a rotary head furnished with pick-and-place heads for mounting the electronic components on the board. The electronic components feeding device comprises tables, where the feeders of the components are mounted, and a moving base for moving the tables in lateral direction.

The electronic components mounting apparatus as described above picks up the components from the feeders and mounts them on the circuit board, which is positioned on an X-Y table when the pick-and-place heads are rotated for indexing along the rotary head.

Further, a multi-table electronic components feeding device with a plurality of tables has been proposed (Japanese Patent Laid-Open Publication No. 300598/1989). Such multi-table feeding device independently moves each of the tables in lateral direction and it is advantageous in that the feeders can be readily exchanged when there is no more electronic component on the feeders.

With the increasing demand on quick and speedier mounting of electronic components in recent years, the moving speed of the above tables must be increased to achieve the mounting in speedy manner. The tables must be stopped at proper position so that the desired feeder stops at the correct pickup position on the pick-and-place heads. However, when the moving speed of the table is increased, the tables may be vibrated when they are stopped, and it is difficult to stop the feeder at the correct pickup position. Because the types of the electronic components to be mounted on the circuit board are increasing and are more diversified, the number of the feeders is also increasing. In some cases, 150 or more feeders must be placed on a table, and the total weight of the table will be 200 kg or more. When such a weighty table is moved at high speed and is stopped suddenly, the table is vibrated extremely. Also, it cannot be started quickly because of inertia when it is stopped.

To solve the above problems, it has been proposed to divide the table into as many tables as possible, turning it to a multi-table. In such a multi-table system, the weight of the table is light, and the moving inertia and the stopping inertia are decreased. Thus, it is possible to move the table at high speed.

However, moving means are required for each of these tables if they are designed in multi-table system, and this means that a large size apparatus is required. Ball screws and nuts or linear motor are used as the moving means, while ball screws, nuts and linear motors are very expensive because high molding accuracy is required. If these are used as the moving means for each of the tables, the manufacturing cost for the electronic components feeding device will be extremely expensive.

SUMMARY OF THE INVENTION

It is an object of the present invention to offer an electronic components feeding device, by which it is possible to move the multi-table system in advantageous manner. It is another object of the present invention to offer an electronic components feeding device, by which it is possible to design the entire system in compact form.

The electronic components feeding device according to the present invention comprises a plurality of tables where feeders of electronic components are placed, a base having said tables movably mounted thereon, a first feeding means for moving said tables in lateral direction along which said tables are arranged in a feeding area at central part of said base in order to stop said feeder at a pickup position on the pick-and-place head, and a second feeding means for moving said tables between retreat areas on the sides of said base and said feeding area.

In the above arrangement, the moving of the tables in the feeding area is performed by the first feeding means, and the moving of the tables between the retreat areas of the table and the feeding area is performed by the second feeding means. By sharing the moving of the tables by two feeding means, the tables can be accurately moved by the first feeding means in the feeding area where high stopping accuracy is required. The tables are moved by the second feeding means between the retreat areas and the feeding area where high stopping accuracy is not required.

BRIEF DESCRIPTION OF THE DRAWINGS

FIG. 4 represents plan views of the apparatus in operation.

Figure 1:
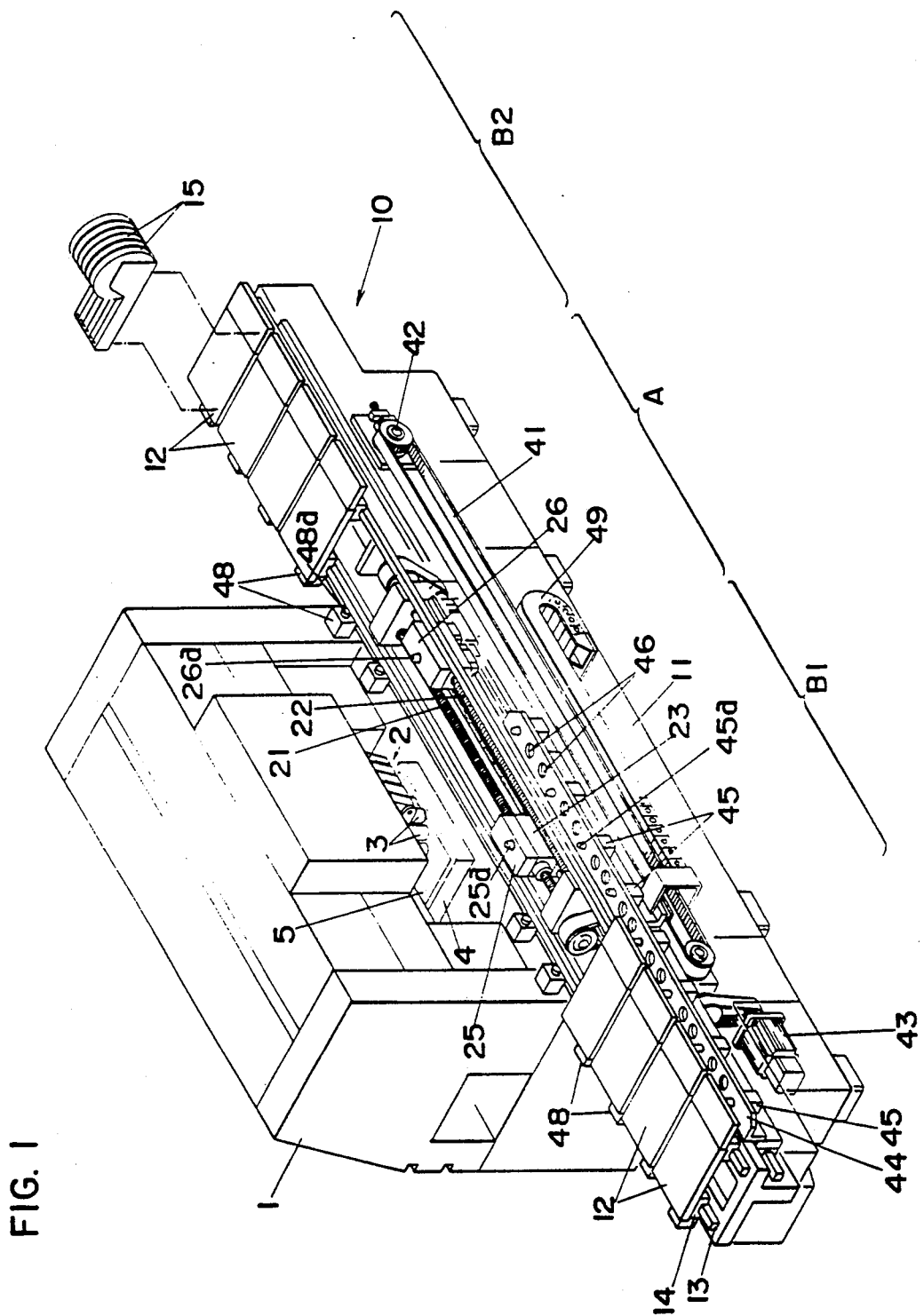
FIG. 1 is a perspective view of an electronic components mounting apparatus.

In the drawings, the reference numeral 2 represents a rotary head, 3 a pick-and-place head, 4 an X-Y table, a circuit board, 10 an electronic components feeding device, 11 a base, 12 a table, 15 a feeder, 21 to 26 first feeding means, 41 to 45 second feeding means, A a feeding area, and B1 and B2 retreat areas.

DETAILED DESCRIPTION OF THE PREFERRED EMBODIMENT

In the following, description is given on an embodiment of the present invention in connection with the drawings.

FIG. 1 is a perspective view of an electronic components mounting apparatus, where the reference numeral 1 designates a main body box provided with a rotary head 2. The rotary head 2 is furnished with a plurality of pick-and-place heads 3, which are rotated for indexing along the rotary head 2. An X-Y table 4 is provided under the rotary head 2, and this X-Y table moves a circuit board 5 in X or Y directions. The numeral 10 indicates an electronic components feeding device. Description is now given on the structure of the apparatus.

The reference numeral 11 designates a base, on which a plurality of tables 12 are placed. In the present embodiment, there are 8 of the tables 12. By dividing the tables 12 into many smaller tables, the weight of each of the tables 12 is decreased. Even when the tables are stopped suddenly on the base when they are moved at high speed, extreme vibration does not occur by shock. This contributes to the higher accuracy of stopping position and the tables can also be smoothly started.

Figure 2:
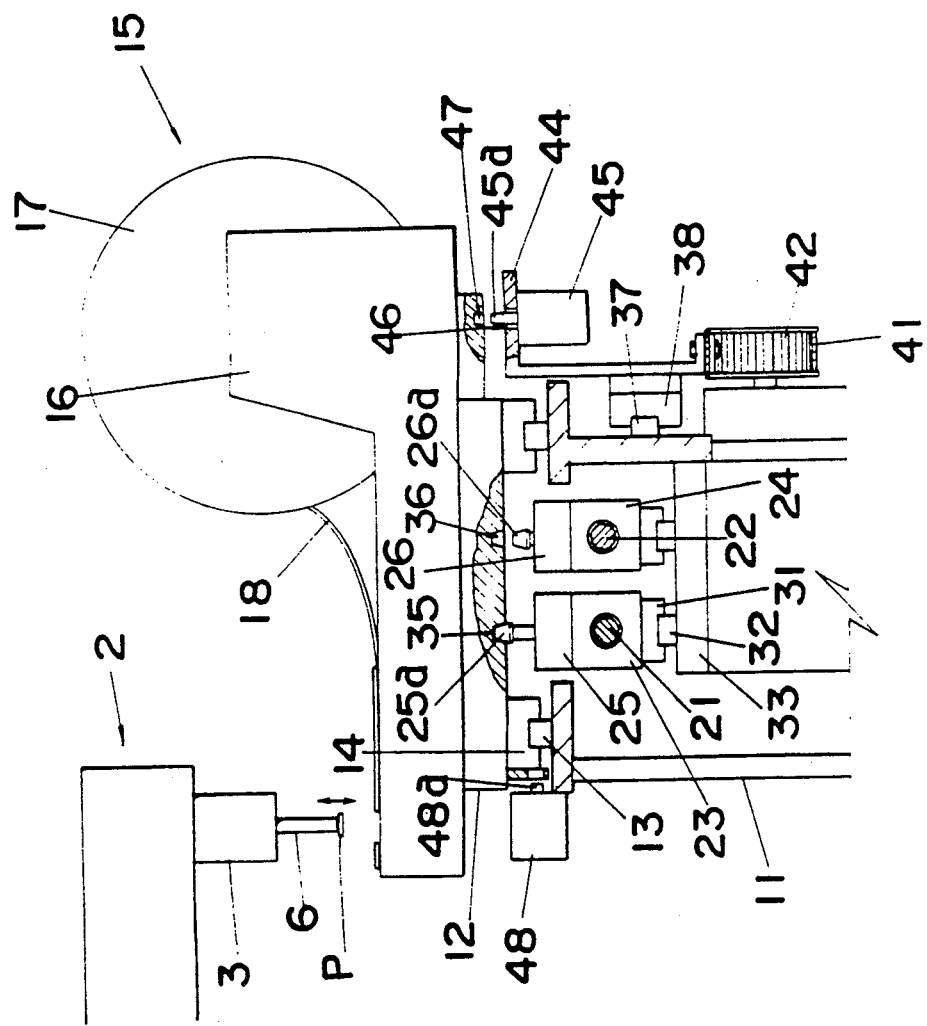
FIG. 2 is a side view of the same.
Figure 3:
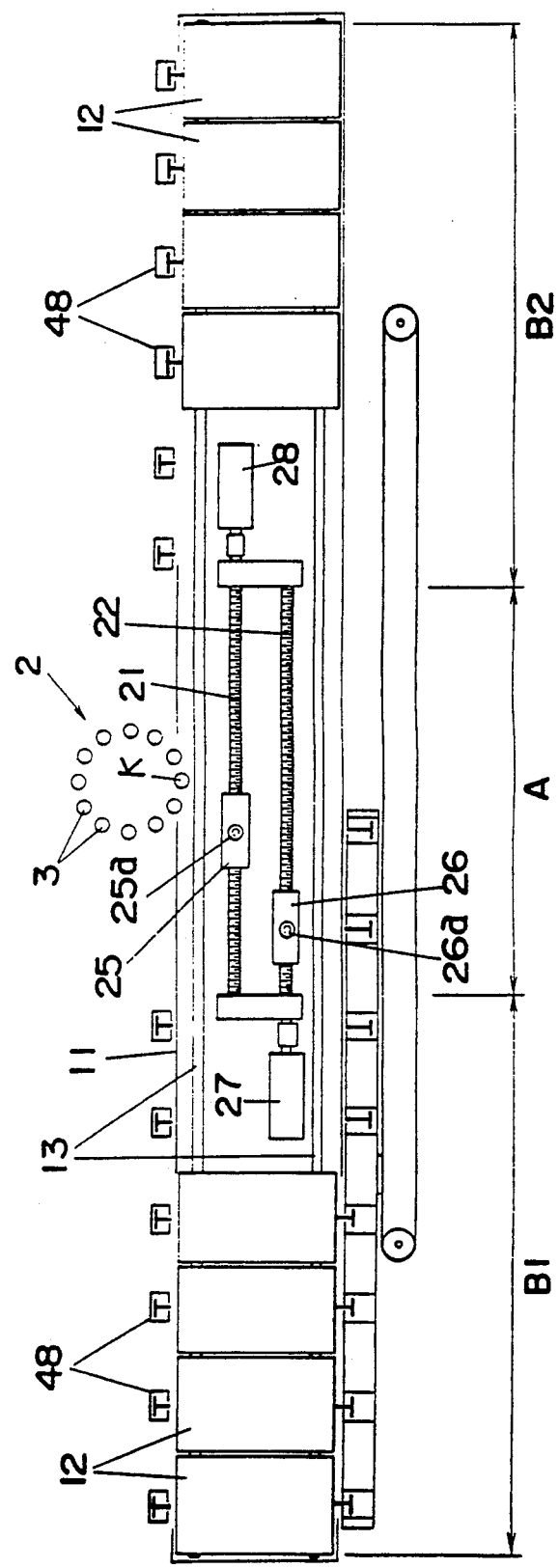
FIG. 3 is a plan view of an electronic components feeding device.

As shown in FIG. 2 and FIG. 3, the base 11 is furnished with rails 13. The tables 12 are provided with sliders 14 engaged with the rails 13, and the tables 12 are moved along the rails 13 in lateral direction.

Tape feeders 15 are placed on the tables 12. Each of the tape feeders 15 comprises a tape feeding reel 17 in a frame 16 and supplies electronic components accommodated in a tape 18. The pick-and-place heads 3 have nozzles 6 and pick up the electronic components P on the tape feeder 15 at a pickup position P. Beside the tape feeder 15 as described above, tube feeders are often used as the feeder.

In FIG. 3, a feeding area A is provided at central part of the base, and retreat areas B1 and B2 are furnished on both sides. Two ball screws 21 and 22 are provided in the working area A, and nuts 23 and 24 are mounted on the ball screws 21 and 22. (See FIG. 22.) Cylinders 25 and 26 are placed on the nuts 23 and 4. When motors 27 and 28 are driven, the nuts are moved along the ball screws 21 and 22. In FIG. 2, the numerals 31 and 32 designate sliders and rails for guiding the slidings of the nuts 23 and 24. holes 35 and 36 are formed on lower portion of the table 12. Rods 25a and 26a of the cylinders 25 and 26 are engaged in these holes 35 and 36.

When the ball screws 21 and 22 are rotated with the rods 25a and 26a engaged in the holes 35 and 36, the table 12 is pulled by the rods 25a and 26a and is moved in lateral direction. That is, the component members 21 to 26 as described above constitute a first feeding means for the tables 12. The ball screws 21 and 22 and the nuts 23 and 24 are provided with precise feeding accuracy, and the desired feeder 15 can be correctly stopped at a pickup position K on the pick-and-place heads 3.

In FIG. 1, a timing belt 41 is furnished on a side of the base 11. The numeral 42 represents a timing pulley, and 43 a motor for driving. A long bracket 44 is mounted on the timing belt 41.

The bracket 44 is provided with cylinders 45. (See FIG. 2.) On the bracket 44, holes 46 are provided at a certain pitch, into which rods 45a of the cylinders 45 are placed penetrate and project through them. In FIG. 2, holes 47 are formed on the lower surface of the tables 12. When the timing belt 41 is rotated with the rods 45a of the cylinders 45 engaged in the holes 47, the tables 12 are pulled by the rods 45a and are moved in lateral direction. In FIG. 2, the reference numeral 37 designates rails and the numeral 38 are sliders for guiding the movement of the bracket 44.

Specifically, the component members 41 to 45 as described above constitute a second feeding means for the tables 12. The second feeding means 41 to 45 moves the tables 12 between the retreat areas B1 and B2 and the feeding area A. Accordingly, the bracket 44 moves extensively between the retreat areas B1 and B2 on both sides. Unlike the first feeding means 21 to 26 as described above, the second feeding means 41 to 45 do not need precise feeding accuracy, and therefore, it comprises low-priced components such as the timing belt 41. The numeral 49 designates an electric cable.

In FIG. 2 and FIG. 3, cylinders 48 are provided on a lateral portion in the retreat areas B1 and B2. By pressing the rods 48a of the cylinders 48 on the side of the tables 12, the tables 12 in retreat are fixed so that they are not moved by the vibration of the base 11. In other words, the cylinders 48 serve as means for fixing the tables 12 in the retreat areas B1 and B2.

FIGS. 4(a) to (m) are plan views of the apparatus in operation. Description is now given on the operating procedure of the apparatus referring these drawings.

In FIG. 4(a), four tables each of 12a to 12d and 12e to 12h are retreated in the retreat areas B1 and B2 respectively. Explanation is given on a case where the tables 12c and 12d are moved from the retreat area B1 to the feeding area A.

By engaging the rods 45a of the cylinders 45 into the holes 47 of the left tables 12a to 12d and by driving the timing belt 41 under this condition, the bracket 44 is slided to the right and the tables 12a to 12d are moved to the central part of the base 1. At the same time, the rods 25a and 26a of the cylinders 25 and 26 of the first feeding means 21 to 26 are engaged in the holes 35 and 36 of the tables 12c and 12d (FIGS. 4(b) and (c)).

Next, the ball screws 21 and 22 are driven, and the tables 12c and 12d are moved to the central part of the feeding area A. By moving the tables 12c and 12d reciprocatively and in lateral direction along the ball screws 21 and 22, electronic components on the feeders 15 of the tables 12c and 12d are supplied to the pick-and-place head 3 (FIG. 4(d)).

When the table 12d is to be exchanged with the table 12b, the table 12d is moved from the feeding area to the retreat area B2 at right (FIG. 4(e)). In this case, the table 12d is not retreated immediately to the retreat area B2, but the table 12d is left in standby state in the feeding area A until an electronic component picked up from the table 12d to the pick-and-place head 3 is recognized. If the electronic component 15 is checked by a recognizing means such as a camera (not shown) as being defective, another electronic component is again supplied from the table 12d to the pick-and-place head 3.

Then, the timing belt 41 is driven to move the tables 12a to 12b slightly rightward, and the cylinder is moved to the left (FIG. 4(f)). By engaging the rod 25a of the cylinder 25 in the hole 35 of the table 12b, the table 12b is moved to the feeding area A (FIG. 4(g)). Next, while moving the tables 12b and 12c in lateral direction along the ball screws 21 and 22, the electronic components on the feeders 15 of the tables 12b and 12c are supplied to the pick-and-place head 3.

When the table 12c is to be exchanged with the table 12a, the table 12c is moved toward the right retreat area B2 (FIG. 4(h)). Then, the timing belt 41 is driven to move the table 12a slightly rightward, and the table 12a is moved to the feeding area A by the cylinder 26 (FIGS. 4(i) and (j)).

Next, the tables 12a and 12b are moved in lateral direction, and electronic components are supplied to the pick-and-place head 3.

To return to the initial state as shown in FIG. 3(a), the tables 12a and 12b are moved to the right (FIGS. 4(k) and (l)), and the tables 12a to 12d are moved together to the retreat area B1 at left by the second feeding means 41 to 45 (FIG. 4(m)).

It is needless to say that the operating modes of the tables 12a to 12d are not limited to the modes as illustrated in FIG. 4, and it can be freely determined which of the tables is positioned in the feeding area A. That is, if it is desired to place the table 12g in the feeding area A, for example, the tables 12e and 12f should be retreated to the retreat area B1 at left by the second feeding means 41 to 45. If 3 ball screws are provided, 3 tables can be independently moved in the feeding area A. If there are not many types of the electronic components to be mounted on the circuit board 5, one table may be placed in the feeding area A and the electronic components may be fed to the pick-and-place head 3. If there is no more electronic component on the feeders 15 placed on the tables 12, the tables 12 can be retreated to the retreat areas B1 and B2 and the feeders 15 can be exchanged. The exchange can be performed by an operator or by an automatic exchange device.

The base 11 may be divided into a moving base of the feeding area A and the bases in the retreat areas B1 and B2. If the multi-table system as described above is not required, the bases of the retreat areas B1 and B2 and the second feeding means 41 to 45 may be accommodated separately from the base of the feeding area A. Then, only a few tables corresponding to the number of the ball screws are placed in the feeding area A, and the electronic components are supplied to the pick-and-place head 3 from these tables. Such mode of operation is advantageous in a case where there are not many types of the electronic components to be mounted on the circuit board 5, and the space requirements for the base can be minimized.

Thus, the following effects can be obtained by the present invention:

(1) Because only a desired table is selected from a plurality of tables and is placed on the feeding area to supply the electronic components to the pick-and-place heads, an apparatus can be provided, which can cope with the production of diverse types of electronic components.

(2) By a multi-table system, each table can be furnished in lightweight design. This makes it possible to minimize the vibration of the tables. Because the moving inertia is minimal, the tables can be stopped at high accuracy, and the desired feeder can be stopped at the correct pickup position. Also, because the tables can be moved at high speed, the electronic components can be supplied quickly to the pick-and-place heads, and the electronic components can be mounted on the circuit board at high speed.

(3) The expensive ball screws may be provided only in the feeding area, and they may be short. Thus, the cost can be reduced.

(4) Because the weight of the tables to be moved by ball screws is light, the loading of the ball screws can be alleviated. Thus, the ball screws are rarely bent, and the motor for driving the ball screws can also be designed smaller.

(5) Because high stopping accuracy and high speed are not required for the second feeding means, the means can be provided at lower cost using a timing belt and other low-priced items.

(6) Because the tables are moved by the first and the second feeding means, the tables can be moved with higher degree of freedom, and the electronic components can be supplied in various modes of operation.

What is claimed is:

1. An electronic components mounting apparatus comprising pick-and-place heads rotated for indexing along a rotary head, and an electronic components feeding device for feeding electronic components to said pick-and-place heads, and an X-Y table for positioning a circuit board, the electronic components of said electronic components feeding device being picked up by said pick-and-place heads and mounted on said circuit board, wherein:

said electronic components feeding device comprises a plurality of tables where feeders of the electronic components are placed, a base having said tables movably mounted thereon, a first feeding means for moving said tables in lateral direction along which said tables are arranged in a feeding area at a central part of said base in order to stop said feeder at a pickup position on the pick-and-place head, and a second feeding means for moving said tables between retreat areas on the sides of said base and said feeding area.

2. An electronic components mounting apparatus according to claim 1, wherein said first feeding means comprises ball screws provided on a central part of said base and nuts screwed on said ball screws.

3. An electronic components mounting apparatus according to claim 2, wherein said nuts are provided with engaging nuts to engage and disengage to and from the tables.

4. An electronic components mounting apparatus according to claim 3, wherein said engaging units are cylinders, and rods of said cylinders are engaged and disengaged to and from holes formed on a lower surface of said tables.

5. An electronic components mounting apparatus according to claim 1, wherein said second feeding means is a timing belt.

6. An electronic components mounting apparatus according to claim 1, wherein said retreat areas are provided with fixing means for fixing said tables.

7. An electronic components mounting apparatus according to claim 6, wherein said fixing means comprises cylinders.

* * * * *